(12) United States Patent
Kang

(10) Patent No.: US 7,739,572 B2
(45) Date of Patent: Jun. 15, 2010

(54) TESTER FOR TESTING SEMICONDUCTOR DEVICE

(75) Inventor: Jong Koo Kang, Yongin-si (KR)

(73) Assignee: UniTest Inc., Gyeonggi-do (KR)

( * ) Notice: Subject to any disclaimer, the term of this patent is extended or adjusted under 35 U.S.C. 154(b) by 286 days.

(21) Appl. No.: 11/782,931

(22) Filed: Jul. 25, 2007

(65) Prior Publication Data

US 2008/0034266 A1     Feb. 7, 2008

(30) Foreign Application Priority Data

Aug. 1, 2006    (KR) .................... 10-2006-0072743

(51) Int. Cl.
G06F 11/00 (2006.01)

(52) U.S. Cl. ............... 714/738; 714/718; 714/719; 714/724; 714/744; 714/736; 714/723; 714/726; 714/5; 714/25; 714/42; 714/721; 714/732; 714/735; 714/743; 714/745; 702/117; 702/108; 324/158.1; 365/201

(58) Field of Classification Search ............ None
See application file for complete search history.

(56) References Cited

U.S. PATENT DOCUMENTS

| | | | | |
|---|---|---|---|---|
| 4,876,685 A | * | 10/1989 | Rich .................... | 714/723 |
| 5,062,109 A | * | 10/1991 | Ohshima et al. ............ | 714/719 |
| 5,225,775 A | * | 7/1993 | Sekino ................ | 324/158.1 |
| 5,432,797 A | * | 7/1995 | Takano .................. | 714/718 |
| 5,919,270 A | * | 7/1999 | Arkin .................... | 714/736 |
| 6,157,200 A | * | 12/2000 | Okayasu .................. | 324/753 |
| 6,363,022 B2 | * | 3/2002 | Tsuto .................... | 365/201 |
| 6,392,404 B1 | * | 5/2002 | Kuglin .................. | 324/158.1 |
| 6,553,529 B1 | * | 4/2003 | Reichert ................ | 714/738 |
| 6,557,128 B1 | * | 4/2003 | Turnquist .............. | 714/724 |
| 6,586,924 B1 | * | 7/2003 | Okayasu et al. ........ | 324/158.1 |
| 6,678,643 B1 | * | 1/2004 | Turnquist et al. ........ | 703/14 |
| 6,772,382 B2 | * | 8/2004 | Schaber et al. .......... | 714/744 |
| 6,779,140 B2 | * | 8/2004 | Krech et al. ............ | 714/718 |
| 6,865,704 B2 | * | 3/2005 | Whannel et al. .......... | 714/726 |
| 7,015,685 B2 | * | 3/2006 | Nakayama .............. | 324/158.1 |
| 7,089,135 B2 | * | 8/2006 | Rajsuman et al. ........ | 702/117 |
| 2002/0028251 A1 | * | 3/2002 | Okay ................... | 424/498 |
| 2002/0165692 A1 | * | 11/2002 | Sato et al. .............. | 702/181 |
| 2003/0217341 A1 | * | 11/2003 | Rajsuman et al. ........ | 716/4 |
| 2007/0061640 A1 | * | 3/2007 | Arkin .................. | 714/724 |

* cited by examiner

*Primary Examiner*—John P Trimmings
(74) *Attorney, Agent, or Firm*—Sughrue Mion, PLLC

(57) ABSTRACT

A tester for testing a semiconductor device is disclosed. The tester for testing the semiconductor device employs a data selector for converting a logical test pattern data transmitted from a pattern generator into a physical test pattern data and an expected data based on the logical test pattern data, thereby generating various timings based on a time delay instead of using a plurality of clocks to improve a test efficiency and reduce a manufacturing cost.

13 Claims, 5 Drawing Sheets

<Prior Art>

<Prior Art>

TESTER FOR TESTING SEMICONDUCTOR DEVICE

CROSS REFERENCE TO RELATED DOCUMENT

This is a non-provisional application which claims priority from Korean Patent Application No. 10-2006-72743, filed on Aug. 1, 2006.

BACKGROUND OF THE INVENTION

1. Field of the Invention

The present invention relates to a tester for testing a semiconductor device, and in particular to a tester for testing a semiconductor device wherein various timings are generated based on a time delay instead of using a plurality of clocks to improve a test efficiency and reduce a manufacturing cost.

2. Description of Prior Art

A tester for testing a semiconductor device tests whether the semiconductor device is defective. The tester for testing the semiconductor device is designed and developed according to a development state of a memory device, a DRAM in particular which takes up most of the memory devices since the tester for testing the semiconductor device is mostly used for testing the memory devices.

The development of the DRAM is progressing from an EDO (Extended Data Output) DRAM, SDRAM (Synchronous DRAM), Rambus DRAM to DDR (Double Data Rate) DRAM.

In order to test the DRAM, a high speed and a high accuracy are required for the tester so as to correspond to a high speed DRAM. In addition, as a capacity of the memory is increased, a time required for testing the DRAM also increases. Therefore, a testing speed is also required to be increased. Moreover, a cost for testing the memory should be reduced by embodying a miniaturized and economical tester.

Of the tester for testing the semiconductor device, the memory tester in particular is typically used for testing and verifying a memory component or a memory module in a form of a SIMM or DIMM. The tester detects a functional defect of the memory module or the memory component prior to an installation thereof in a real computer system.

The tester is classified into a hardware semiconductor device tester and a software diagnostic program executed in a PC environment. However, since the software diagnostic program diagnoses a state of the memory when the memory module or the memory component is installed in the real computer, the hardware semiconductor device tester is mainly used during a semiconductor memory manufacturing process.

The tester may be classified as a high-end tester referred to as an ATE (Automatic Test Equipment), a medium range memory tester and a low-end memory tester.

The ATE which is the high-end tester is typically used in order to carry out a test process of the memory device. The conventional ATE carries out tests such as a DC test for testing whether a DC parameter is suitable for a digital operation of a circuit, a transmission delay time of signals, and an AC margin related to a set-up time and a hold time. The ATE also generates a test pattern and a timing for the test. However, a manufacturing cost of the ATE is high since the ATE is manufactured using a dedicated equipment such as a main frame having a large size and a high price.

FIG. 1 is a block diagram illustrating a conventional tester for testing a semiconductor device.

As shown in FIG. 1, the conventional tester comprises a pattern generator 110, a timing generator 120, a format controller 130, a driver 140, a comparator 150, and a test result storage 160. In addition to these components, the conventional tester may comprise a power supply controller for the DC test, a component for generating a clock signal, a component for supplying a power for an operation of a DUT (Device Under Test) 180, a component for relaying a test pattern data to the DUT 180 and receiving a test result from the DUT 180, a component for receiving a test pattern program from an outside, and a component for transmitting the test result to the outside. However, a description thereof is omitted.

The pattern generator 110 generates the test pattern data required for testing the DUT 180 based on the test pattern program. For instance, the test pattern program is written to include an instruction for carrying out various operations in order to carry out the test. The pattern generator 110 generates the test pattern data by receiving and interpreting the test pattern program from an external storage for instance. The test pattern data includes a data such as a command, address and a data inputted to the DUT 180. In addition, an expected data corresponding to the generated test pattern data is generated.

The timing generator 120 generates a timing edge which is a reference for converting the test pattern data generated in the pattern generator 110 into various waveforms. The timing edge is generated using a plurality of clocks for a smooth conversion.

The format controller 130 converts the test pattern data to a desired waveform based on the timing edge.

The conversion of the test pattern data is described below in detail.

FIG. 2 is a diagram illustrating an example of converting a test waveform in a conventional tester for testing a semiconductor device.

Referring to FIG. 2, the pattern generator 110 generates the test pattern data. On the other hand, the timing generator 120 generates a plurality of timing edges using a plurality of clocks ACLK, BCLK and CCLK as shown. Because the format controller 130 requires a timing reference in order to convert the test pattern data to the desired test waveform at a desired moment, the timing generator 120 generates the plurality of timing edges using the plurality of clocks in order to configure the timing reference. The plurality of clocks is particularly used to generate the pattern data for a test of an asynchronous semiconductor device.

The format controller 130 converts the test pattern to the desired test waveform based on each of the timing edges. For instance, when the clock ACLK is used, the format controller 130 may convert the test pattern data to the test waveform of NRZA or /NRZA. "NRZ" represents a conversion wherein '0' is not returned during a cycle in which the test pattern data is '1', a character "A" represents that the test pattern data is converted through the clock ACLK, and a character "/" represents that the test pattern data is inverted. When the clock BCLK is used, the format controller 130 may convert the test pattern data to the test waveform of NRZB or /NRZB. When the clock CCLK is used, the format controller 130 may convert the test pattern data to the test waveform of NRZC or /NRZC. When the clocks BCLK and CCLK are used simultaneously, the format controller 130 may convert the test pattern data to the test waveform of NRZBC or /NRZBC. As described above, the test pattern data may be converted to the test waveform by the format controller 130 using the plurality of clocks.

The driver 140 transmits the converted test waveform to the DUT 180.

The comparator 150 tests the DUT 180 by comparing the test output data being outputted from the DUT 180 after an operation of the DUT 180 is complete by the test waveform applied to the DUT 180 with the expected data generated in the pattern generator 110.

The test result storage 160 stores a test result based on a result of the comparison of the comparator 150. For instance, an information on a defective DUT is stored.

As described above, the conventional ATE is a very highly priced equipment. Therefore, it is preferable that a manufacturer designs the highly priced ATE efficiently in order to increase a competitiveness by minimizing a manufacturing cost thereof. For the efficient design of the ATE, the generation of the test pattern and the timing should be optimized.

Particularly, in order to embody the timing generating function of the timing generator 120, a highly priced components are required. In addition, even when the highly priced components are used, a function of generating an accurate timing for the test of the semiconductor device operating at a high speed is difficult to embody. The function of generating the timing using the plurality of clocks may be used for the test of asynchronous device. However, the function of generating the timing using the plurality of clocks is not optimum for a synchronous device.

Moreover, the when the converted test waveform is transmitted to the DUT 180, the test waveform may be delayed for a predetermined cycle. The expected data may be also delayed by the comparator 150 in order to carry out the comparison with the data being outputted from the DUT 180. Because the delays are carried out after the conversion by the format controller 130, the driver 140 or the comparator 150 may convert an actual test waveform or the expected data again by considering each of the delays.

In addition, the test pattern data generated in the pattern generator 110 should be converted according to each of channels of the DUT 180, i.e. pins of the DUT 180. The conversion for the pins is carried out before the test pattern data is applied to the format controller 130. In such case, a multiplexing of the test pattern data to be applied to each of the pins is carried out. However, because the multiplexing is carried out to correspond to the each of the pins, a resource is wasted.

SUMMARY OF THE INVENTION

It is an object of the present invention to provide a tester for testing a semiconductor device wherein various timings are generated based on a time delay instead of using a plurality of clocks to improve a test efficiency and reduce a manufacturing cost.

In order to achieve the above-described objects of the present invention, there is provided a tester for testing a DUT, the tester comprising: a pattern generator for generating a logical test pattern data for a test of the DUT based on a test pattern program; a data selector for converting the logical test pattern data transmitted from the pattern generator into a physical test pattern data and an expected data based on the logical test pattern data; a format controller for converting the physical test pattern data to a test waveform based on a time delay value set for the test; a driver for applying the test waveform to the DUT; an output comparator for receiving an output corresponding to the test waveform from the DUT to output a test output data; and a test comparator for comparing the test output data with the expected data to determine the DUT is a defective DUT; a multiplexer for multiplexing the test waveform to comply with an operating speed of the DUT; a de-multiplexer for de-multiplexing the test output data to comply with an operating speed of the comparison of the test output data with the expected data; a timing controller for carrying out an oversampling of the test waveform prior to applying the test waveform to the multiplexer; and a bit shifter for shifting the test waveform by a unit of a bit to be applied to the multiplexer after carrying out the oversampling.

It is preferable that the test in accordance with the present invention further comprises a latency controller for applying the physical test pattern data and the expected data to the format controller and the test comparator respectively by controlling latencies thereof.

It is preferable that the test in accordance with the present invention further comprises a deskew controller for compensating a timing skew generated in each of the channels of the DUT prior to transmitting the test waveform to the DUT through the driver or after receiving the test output data from the DUT through the output comparator.

Preferably, the test in accordance with the present invention further comprises the deskew controller compensates the timing skew by setting the timing skew for each of the channels.

It is preferable that the test in accordance with the present invention further comprises a deskew controller for compensating a timing skew generated in each of the channels of the DUT prior to transmitting the test waveform multiplexed by the multiplexer to the DUT through the driver or after receiving the test output data from the DUT through the output comparator, and wherein the deskew controller is associated with the bit shifter in a manner that the timing skew is partially compensates through the bit shifter when the timing skew is larger than a predetermined value.

Preferably, the test in accordance with the present invention further comprises the deskew controller compensates the timing skew by skew by setting the timing skew for each of the channels.

It is preferable that the driver applies the test waveform to the DUT in a manner that the test waveform has one of three levels 'high', 'low' and 'termination'.

Preferably, the test in accordance with the present invention further comprises the output comparator compares the output corresponding to the test waveform form received from the DUT with a threshold value to output the test output data.

It is preferable that the threshold value is variable.

Preferably, the test in accordance with the present invention further comprises the output comparator is configures a window based on the threshold value and determines an output level for a signal outside the window.

It is preferable that the test comparator comprises: a resynchronizer for carrying out a resynchronization of the test output data by considering a round trip delay between the tester and the DUT; and a round trip delay compensator for delaying the expected data according to the round trip delay.

Preferably, the test in accordance with the present invention further comprises the test pattern generator generates a control flag for the conversion of the logical test pattern data to the physical test pattern data based on each of channels of the DUT to be transmitted to the data selector, and wherein the data selector converts the logical test pattern data to the physical test pattern data to be transmitted through each of the channels of the DUT based on the control flag by referring to a plurality of predesignated data selection tables.

It is preferable that the test in accordance with the present invention further comprises a test result transmitter for transmitting a result of the test to an external device.

DETAILED DESCRIPTION OF THE PREFERRED EMBODIMENTS

The present invention will now be described in detail with reference to the accompanied drawings.

Figure 3:
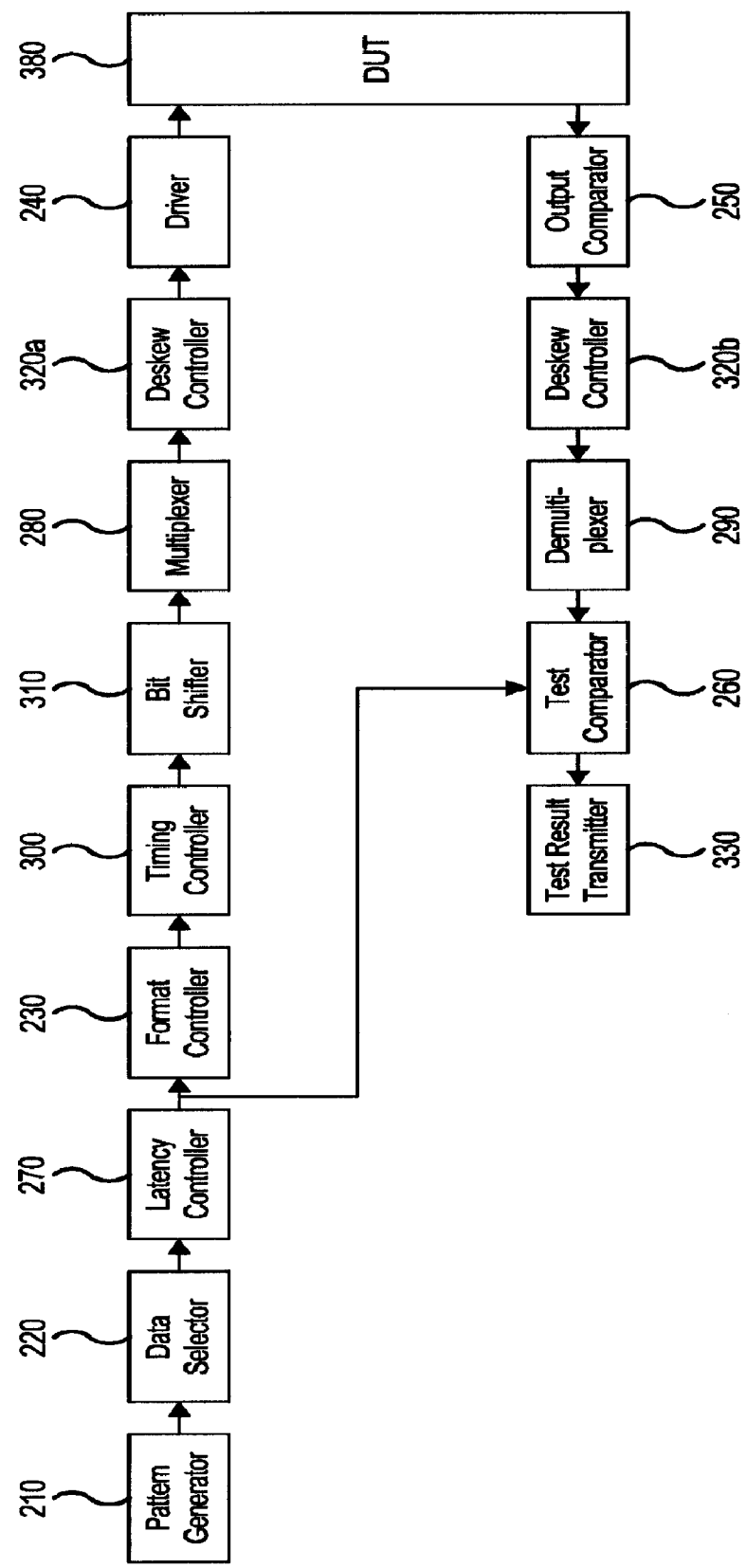
FIG. 3 is a block diagram exemplifying the test a tester for testing a semiconductor device in accordance with the present invention.

FIG. 3 is a block diagram exemplifying the test a tester for testing a semiconductor device in accordance with the present invention.

Referring to FIG. 3, the tester comprises a pattern generator 210, a data selector 220, a format controller 230, a driver 240, an output comparator 250 and a test comparator 260. In addition, the tester may further comprise a latency controller 270, a multiplexer 280, a de-multiplexer 290, a timing controller 300, a bit shifter 310, a deskew controller 320 and a test result transmitter 330.

The tester for testing the semiconductor device in accordance with the present invention is characterized in that a function for carrying out a generation of a test pattern data or a conversion of a format that is to be optimized for an efficient configuration thereof is included. Accordingly, the tester includes components for applying a test waveform having a format thereof converted to a DUT (Device Under Test) 380 and determining whether the DUT 380 is a defective DUT by comparing a data received from the DUT 380 with an expected data.

In addition, the tester includes components for distributing the test waveform from the driver 240 to a plurality of DUTs and receiving a result of a test from the plurality of DUTs. However, a detailed description thereof is omitted.

The pattern generator 210 generates a logical test pattern data for a test a semiconductor to be tested, i.e. the DUT 380 based on a test pattern program. For instance, the pattern generator 210 compiles a test pattern program written by a programmer and generates the logical test pattern data based on the test pattern program. The logical test pattern data includes a command signal, an address signal and a data signal. The pattern generator 210 may also generate a control flag based on each of channels of the DUT 380, i.e. each of pins of the DUT 380 to be transmitted to the data selector 220.

The data selector 220 converts the logical test pattern data transmitted from the pattern generator 210 into a physical test pattern data to be transmitted to the DUT 380 and an expected data based on the logical test pattern data. That is, the logical test pattern data generated by the pattern generator 210 is not transmitted to the entire channels of the DUT 380 as is. The logical test pattern data is converted for and transmitted to each of the channels. In order to achieve this, the data selector 220 converts the logical test pattern data into the physical test pattern data to be transmitted to each of the channels of the DUT 380.

In addition, the pattern generator 210 may generate the control flag to be transmitted to the data selector 220. When the control flag is used, the data selector 220 may convert the logical test pattern data in the physical test pattern data based on the control flag using a predetermined conversion routine. Therefore, a conversion speed is improved. That is, the data selector 220 may convert the logical test pattern data to the physical test pattern data to be transmitted through each of the channels of the DUT based on the control flag by referring to a plurality of pre-designated data selection tables. In such case, a DUT interface having a multiplexed structure or a protocol structure is possible.

The format controller 230 converts the physical test pattern data to a test waveform based on a time delay value set for carrying out the test. That is, the desired test waveform is generated based on the physical test pattern data. The time delay value may be set by the programmer when writing the test pattern program.

The driver 240 applies the test waveform which is an output of the format controller 230 to the DUT 380. For instance, the driver 240 applies the test waveform to the DUT 380 in a manner that the test waveform has one of three levels 'high', 'low' and 'termination'. That is, when a reflective component is to be removed during applying the test waveform to the DUT 380, the level 'termination' is selected. In other case, the level 'high' or 'low' is selected.

The output comparator 250 receives an output signal corresponding to the test waveform from the DUT 380 generated by the test waveform applied to the DUT 380 to output a test output data.

The output comparator 250 may carry out a comparison based on a predetermined threshold value. In addition, the threshold value may be varied according to a test environment, a characteristic of the channel or a characteristic of the DUT 380, thereby efficiently generating the test output data. Moreover, when the output comparator 250 converts the output signal corresponding to the test waveform based on the threshold value to the test output data, a conversion of a signal about to the threshold value may be inaccurate. In such case, a window is configured about the threshold value to determine an output level for a signal outside the window so as to generate the test output data.

The test comparator 260 compares the test output data being outputted from the output comparator 250 with the expected data in the data selector 220 to determine the DUT 380 is a defective DUT.

Figure 4:
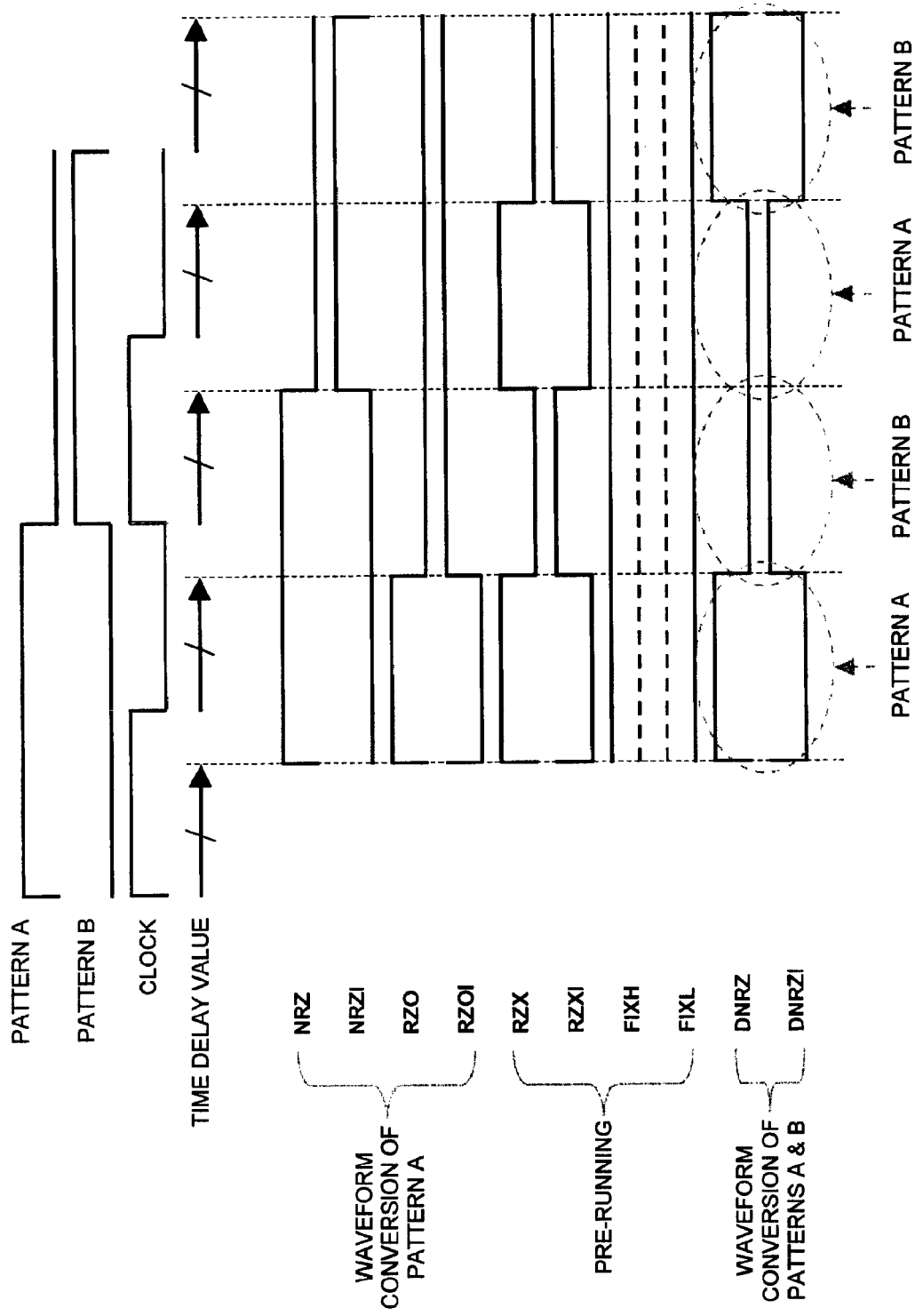
FIG. 4 is a diagram illustrating an example of converting a test waveform in a tester for testing a semiconductor device in accordance with the present invention.

FIG. 4 is a diagram illustrating an example of converting the test waveform in the tester for testing the semiconductor device in accordance with the present invention.

A pattern A and a pattern B represents example of the physical test pattern data generated from converting the logical test pattern data generated in the pattern generator 210 through the data selector 220.

A "clock" represents a reference clock for the conversion of the test waveform, and "time delay value" represents a value set for the conversion of the test waveform by the programmer.

The format controller 230 converts the physical test pattern data to the test waveform using the reference clock the time delay value. For instance, NRZ, NRZI, RZO and RZOI represents examples of the test waveform converted based on the pattern A, and DNRZ and DNRZI represents examples of the test waveform converted based on the patterns A and B.

Figure 1:
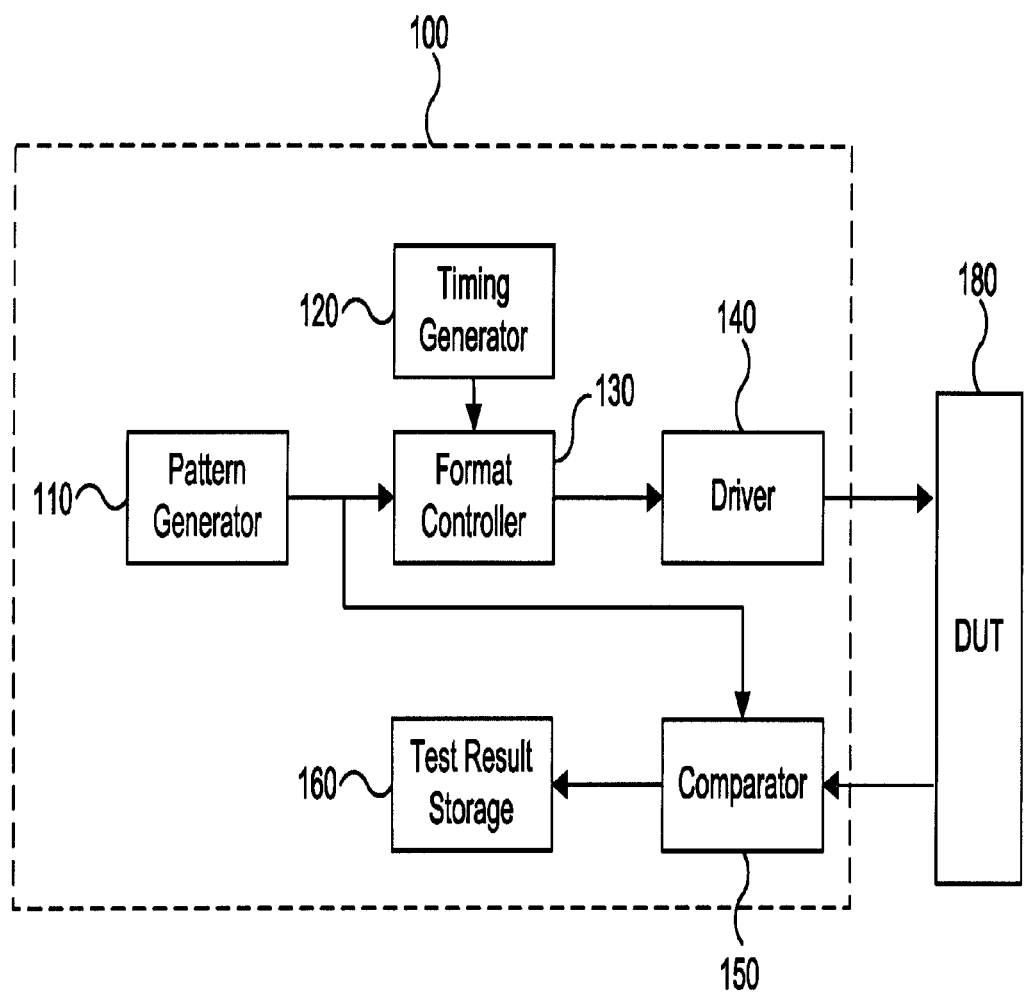
FIG. 1 is a block diagram illustrating a conventional tester for testing a semiconductor device.
Figure 2:
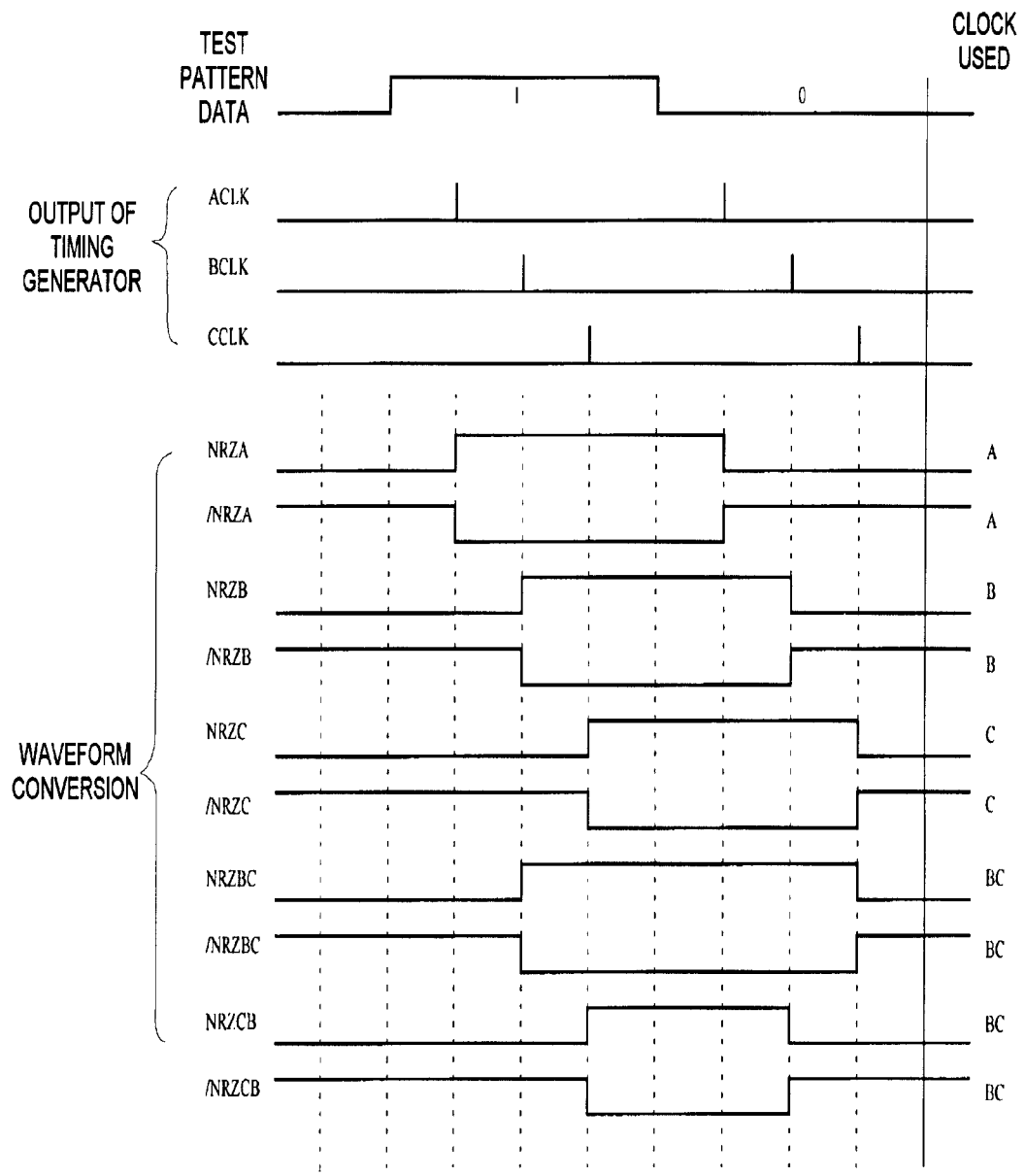
FIG. 2 is a diagram illustrating an example of converting a test waveform in a conventional tester for testing a semiconductor device.

The tester in accordance with the present invention is characterized in that the tester does not include a timing generator used in the conventional tester. That is, while the tester shown in FIG. 2 generates the timing using the plurality of clocks to generate the test waveform, the tester in accordance with the present invention shown in FIG. 4 uses only the reference clock instead of the plurality of clocks and carries out the conversion based on the time delay value. Therefore, the highly priced timing generator is not required.

The tester in accordance with the present invention may further comprise components for an efficient embodiment of the tester in addition to above-described components.

The latency controller 270 applies the physical test pattern data and the expected data to the format controller 230 and the test comparator 260 respectively by controlling latencies thereof. The latencies may be controlled by delaying the physical test pattern data and the expected data for a predetermined cycle.

While the physical test pattern data and the expected data are delayed for the predetermined cycle after the test waveform is generated in accordance with the conventional tester, the test waveform may be converted based on only the reference clock and the time delay value in accordance with the present invention. Therefore, the physical test pattern data and the expected data are delayed for the predetermined cycle prior to the conversion of the test waveform in accordance with the present invention. In addition, when a FIFO (first-in first-out) device is used, a configuration of the latencies according to a writing to the DUT 380 or reading from the DUT 380 is automatically carried out. Therefore, the programmer may easily employ the program without a special configuration.

Moreover, while a high speed operation is required as an operation speed of the semiconductor device gets higher, the test waveform is mainly generated for a low speed operation. Therefore, the test waveform is required to be multiplexed in order to correspond to an operating speed of the semiconductor device or to be de-multiplexed in order to carry out the comparison of the test output data with the expected data.

The multiplexer 280 multiplexes the test waveform to comply with the operating speed of the DUT 380, and the de-multiplexer 290 de-multiplexes the test output data to comply with an operating speed suitable for the comparison of the test output data with the expected data.

Prior to the multiplexing by the multiplexer 280, an oversampling of the test waveform may be carried out. That is, the tester may include the timing controller 300 that carries out the oversampling in order to apply the test waveform of a low frequency to the multiplexer 280 operating at a high speed.

An object of the oversampling is to convert a data of the low frequency into a data of a high frequency. Therefore, the oversampling of the test waveform may be applied to the multiplexer 280 designed to operate only at the high frequency.

The tester may comprise the bit shifter 310 for shifting the test waveform by a unit of a bit to be applied to the multiplexer 280 after carrying out the oversampling. That is, the bit shifter 310 may shift the test waveform by the unit of the bit to generate a desired waveform additionally or set a time delay.

On the other hand, a timing skew occurring in the channels of the DUT 380 may differ for each of the channels. That is, because a signal transmission environment is not same for each of the channels, the timing skew is generated. Therefore, a function for compensating the timing skew for each of the channels is required prior to transmitting the test waveform to the DUT 380 through the driver 240 or after receiving the test output data from the DUT 380 through the output comparator 250. In order to compensate the timing skew, the tester in accordance with the present invention may include deskew controllers 320a and 320b.

Preferably, the deskew controllers 320a and 320b configures the timing skew for each of the channels of the DUT 380 using a programmable timing delay device.

The deskew controller 320a compensates the timing skew prior to transmitting the test waveform to the DUT 380 through the driver 240. However, when the timing skew is of a very large scale, the deskew controller 320a may not be able to compensate the timing skew. That is, a range of the timing skew that may be compensated by the deskew controller 320a differs depending on the programmable timing delay device. The programmable timing delay device that is capable of compensating the timing skew of a large range is very highly priced and has a poor compensation characteristic. Therefore, when the deskew controller 320a compensates the timing skew larger than a predetermined value, the deskew controller 320 may be configured to be associated with the bit shifter 310 to compensate the timing skew.

That is, the bit shifter 310 primarily compensates the timing skew that is out of the range that may be compensated by the deskew controller 320a. After the bit shifter 310 carries out the primary compensation, the deskew controller 320a may secondarily compensate the timing skew within the range that may be compensated by the deskew controller 320a. Accordingly, the timing skew of the large scale may be compensated.

In addition, when the test waveform is transmitted between the tester in accordance with the present invention and the DUT 380, the test output data is received based on the test waveform, and the expected data and the test output data are compared by the test comparator 260, the test comparator 260 takes the round trip delay into account. That is, the test comparator 260 takes the delays that vary during the transmission process of the signals through different paths into account.

Therefore, the compensation for the round trip delay is not carried out efficiently. However, in accordance with the present invention, a device such as the FIFO device is used to efficiently compensate for the round trip delay.

The test comparator 260 may further comprise a resynchronizer (not shown) for carrying out a resynchronization of the test output data by considering the round trip delay between the tester and the DUT 380 and a round trip delay compensator (not shown) for delaying the expected data according to the round trip delay. The resynchronizer and the round trip delay compensator may comprise the FIFO device respectively.

In such case, test pattern program may be easily created by the programmer without a special configuration.

As described above, the test pattern data generated in the pattern generator 210 includes the command, the address and the data signal.

In such case, the tester in accordance with the present invention may further comprise a test result storage (not shown) for storing an information on the defective DUT determined by the test comparator 260 or an information on the test pattern program.

The information on the defective DUT may be an identification information of a position of the defective DUT and may include a cell address of a defective cell. In addition, the information on the test pattern program may be corresponding command, address and data when the defective DUT detected.

The informations stored in the test result storage (not shown) may be used for removing the defective DUT or a debugging of the test pattern program.

The tester in accordance with the present invention may further comprise the test result transmitter 330 for transmitting the test result of the test comparator 260, i.e. the information on the defective DUT and a data information to an external apparatus so that the user may easily review the test result.

Figure 5:
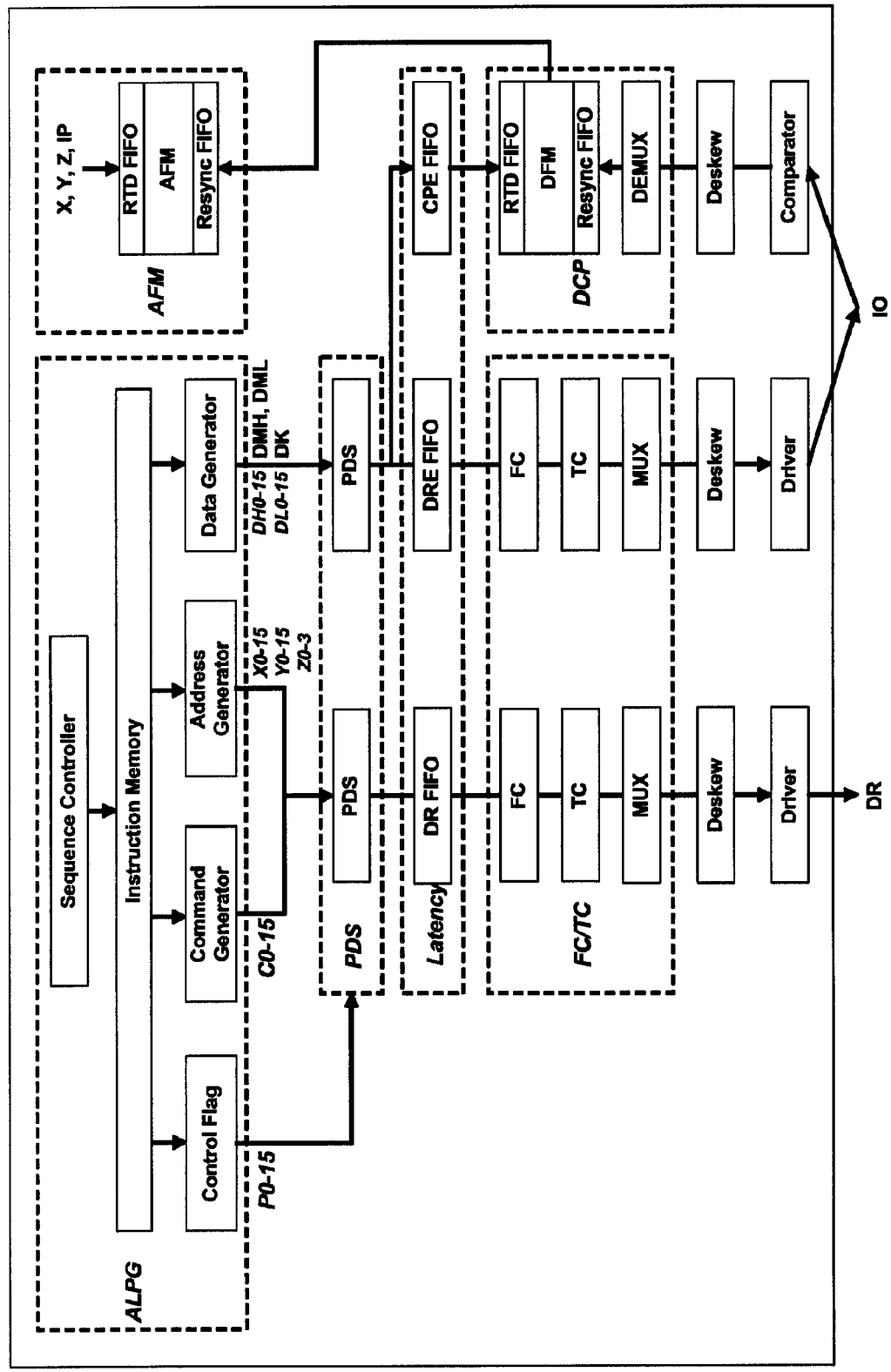
FIG. 5 is a diagram illustrating an actual embodiment of a tester for testing a semiconductor device in accordance with the present invention.

FIG. 5 is a diagram illustrating an actual embodiment of the tester for testing the semiconductor device in accordance with the present invention.

"ALPG" represents the pattern generator 210. The pattern generator 210 comprises an "Instruction Memory" storing binary data obtained by compiling the test pattern program, "Sequence Controller" for sequentially reading a data stored in the "Instruction Memory", and a "Command Generator", "Address Generator" and "Data Generator" for generating the command, address or the data required for the test of the DUT. The pattern generator 210 also generates the "Control Flag".

"PDS" represents the data selector 220. As shown, the data selector 220 converts the command, the address and the data based on the "Control Flag".

"Latency" represents the latency controller 270. The latency controller employs the FIFO to adjust the delays. In case of the command and the address, because the command and the address are only required to be transmitted to the DUT, a DR (drive) FIFO is used. In case of the data, because the data should be transmitted to the DUT and also compared with the expected data, a DRE (drive enable) FIFO and a CPE (compare enable) FIFO are used.

"FC/TC" represent the format controller 230, the multiplexer 280, the demultiplexer 280, the timing controller 300 and the bit shifter 310.

"FC" represents the format controller 230, "TC" represents the timing controller 300 and the bit shifter 310. In addition, "MUX" and "DEMUX" correspond to the multiplexer 280 and the demultiplexer 290, respectively.

"Deskew" corresponds to the deskew controller 320, "Drive" corresponds to the driver 240, "Comparator" corresponds to the output comparator 250 and "DCP (digital comparator)" corresponds to the test comparator 260.

"DFM (data fail memory)" and "AFM (address fail memory)" corresponds to the test result storage.

Each of "DCP" and "AFM" comprises "Resync FIFO" corresponding to the resynchronizer and "RTD FIFO" corresponding to the round trip delay compensator. In addition, "DCP" compares the data and stores the information on the defective DUT in "DFM (data fail memory)", and the corresponding address is transmitted and stored in "AFM".

While the present invention has been particularly shown and described with reference to the preferred embodiment thereof, it will be understood by those skilled in the art that various changes in form and details may be effected therein without departing from the spirit and scope of the invention.

As described above, in accordance with the tester for testing the semiconductor device of the present invention, the various timings are generated based on the time delay instead of using the plurality of clocks to improve the test efficiency and reduce the manufacturing cost.

The invention claimed is:

1. A tester for testing a device under test (DUT), the tester comprising:
    a pattern generator for generating a logical test pattern data for a test of the DUT based on a test pattern program;
    a data selector for converting the logical test pattern data transmitted from the pattern generator into a physical test pattern data and an expected data based on the logical test pattern data;
    a format controller for converting the physical test pattern data to a test waveform based on a time delay value set for the test;
    a driver for applying the test waveform to the DUT;
    an output comparator for receiving an output corresponding to the test waveform from the DUT to output a test output data; and
    a test comparator for comparing the test output data with the expected data to determine the DUT is a defective DUT; a multiplexer for multiplexing the test waveform to comply with an operating speed of the DUT;
    a de-multiplexer for de-multiplexing the test output data to comply with an operating speed of the comparison of the test output data with the expected data;
    a timing controller for carrying out an oversampling of the test waveform prior to applying the test waveform to the multiplexer; and
    a bit shifter for shifting the test waveform by a unit of a bit to be applied to the multiplexer after carrying out the oversampling.

2. The tester in accordance with claim 1, further comprising a latency controller for applying the physical test pattern data and the expected data to the format controller and the test comparator respectively by controlling latencies thereof.

3. The tester in accordance with claim 1, further comprising deskew controllers for compensating a timing skew generated in each of the channels of the DUT prior to transmitting the test waveform to the DUT through the driver and after receiving the test output data from the DUT through the output comparator.

4. The tester in accordance with claim 3, wherein the deskew controller compensates the timing skew by setting the timing skew for each of the channels.

5. The tester in accordance with claim 1, further comprising deskew controllers for compensating a timing skew generated in each of the channels of the DUT prior to transmitting the test waveform multiplexed by the multiplexer to the DUT through the driver and after receiving the test output data from the DUT through the output comparator, and
    wherein the deskew controllers are associated with the bit shifter in a manner that the timing skew is partially compensated through the bit shifter when the timing skew is larger than a predetermined value.

6. The tester in accordance with claim 5, wherein the deskew controller compensates the timing skew by setting the timing skew for each of the channels.

7. The tester in accordance with claim 1, wherein the driver applies the test waveform to the DUT in a manner that the test waveform has one of three levels 'high', 'low' and 'termination'.

8. The tester in accordance with claim 1, wherein the output comparator compares the output corresponding to the test waveform received from the DUT with a threshold value to output the test output data.

9. The tester in accordance with claim 8, wherein the threshold value is variable.

10. The tester in accordance with claim 8, wherein an output level configures a window based on the threshold value and determines an output level for a signal outside the window.

11. The tester in accordance with claim 1, wherein the test comparator comprises:
    a resynchronizer for carrying out a resynchronization of the test output data by considering a round trip delay between the tester and the DUT; and
    a round trip delay compensator for delaying the expected data according to the round trip delay.

12. The tester in accordance with claim 1, wherein the test pattern generator generates a control flag for the conversion of the logical test pattern data to the physical test pattern data based on each of channels of the DUT to be transmitted to the data selector, and wherein the data selector converts the logical test pattern data to the physical test pattern data to be transmitted through each of the channels of the DUT based on the control flag by referring to a plurality of pre-designated data selection tables.

13. The tester in accordance with claim 1, further comprising a test result transmitter for transmitting a result of the test to an external device.

* * * * *